United States Patent [19]

Tu et al.

[11] Patent Number: 5,714,285
[45] Date of Patent: Feb. 3, 1998

[54] USING $(LaNiO_3)_x(TiO_2)_{1-x}$ OXIDE ABSORPTION COMPOSITE FOR ATTENUATING PHASE SHIFTING BLANKS AND MASKS

[75] Inventors: Chih-Chiang Tu, Tan-yen; Jon-Yiew Gan, Chushan; Tai-Bor Wu, Hsinchu; Chao-Chen Cheng, Taipei, all of Taiwan

[73] Assignee: Taiwan Semiconductor Manufacturing Company, Ltd., Hsin-Chu, Taiwan

[21] Appl. No.: 682,475

[22] Filed: Jul. 17, 1996

[51] Int. Cl.⁶ .................................................. G03F 9/00
[52] U.S. Cl. .................................................. 430/5
[58] Field of Search .................................................. 430/5

[56] References Cited

U.S. PATENT DOCUMENTS

| | | | |
|---|---|---|---|
| 5,268,244 | 12/1993 | Yoo | 430/5 |
| 5,415,953 | 5/1995 | Alpay et al. | 430/5 |
| 5,609,977 | 3/1997 | Iwamatsu et al. | 430/5 |
| 5,614,335 | 3/1997 | Hashimoto et al. | 430/5 |
| 5,629,115 | 5/1997 | Kawano et al. | 430/5 |

*Primary Examiner*—Mark Chapman
*Attorney, Agent, or Firm*—George O. Saile; Stephen B. Ackerman; Larry J. Prescott

[57] ABSTRACT

An attenuating phase shifting photomask is formed using attenuating phase shifting composite material combining the optical properties of a first material having a high extinction coefficient and a second material having a high index of refraction. The first material is $LaNiO_3$ and the second material is $TiO_2$. The first and second materials are combined as a composite of $(LaNiO_3)_x(TiO_2)_{1-x}$ to form attenuating phase shifting blanks and masks. Co-deposition of $LaNiO_3$ and $TiO_2$ using rf magnetron sputtering is used to form the $(LaNiO_3)_x(TiO_2)_{1-x}$ film on a transparent quartz substrate.

14 Claims, 6 Drawing Sheets

USING (LANIO$_3$)$_x$(TIO$_2$)$_{1-x}$ OXIDE ABSORPTION COMPOSITE FOR ATTENUATING PHASE SHIFTING BLANKS AND MASKS

BACKGROUND OF THE INVENTION
(1) Field of the Invention

This invention relates to attenuating phase shifting photomasks and more particularly to the formation of attenuating phase shifting material using a composite of a first material with a high extinction coefficient and a second material with a high index of refraction to achieve desired optical properties. More particularly the first material is LaNiO$_3$ and the second material is TiO$_2$.

(2) Description of Related Art

As optical lithography advances to smaller spacings and tighter tolerances phase shifting type photomasks are often used to achieve improved tolerances and pattern edge definition.

U.S. Pat. No. 5,286,244 to Yoo describes methods for making phase shifting photomasks using silicon oxide and silicon nitride materials. The invention described in this patent application uses the optical properties of (LaNiO$_3$)$_x$(TiO$_2$)$_{1-x}$ oxide absorption composite to form attenuating phase shifting blanks and masks for use in photolithographic processes.

SUMMARY OF THE INVENTION

FIG. 1 shows a block diagram of a conventional reduction stepper for projecting a mask image onto an integrated circuit wafer. A light beam 11 passes through the mask 10 and into the reduction stepper 20, usually a 5 times reduction stepper. The light emerging from the reduction stepper is focussed on the integrated circuit element 30 and the image is formed on the integrated circuit element.

FIG. 2 shows a cross section view of a prior art binary mask, the electric field of the light emerging from the mask, and the intensity of the light at the integrated circuit wafer. The mask comprises a transparent substrate 12 with a pattern formed in a layer of opaque material 14, such as chrome. A beam of light 16 impinges on the binary mask. The electric field, E, of the light exiting the mask and the intensity, I, of the light focused on the integrated circuit wafer is also shown in FIG. 2. As can be seen in FIG. 2 the intensity, I, of the light does not return completely to zero at the position where the electric field, E, of the light emerging from the mask returns to zero resulting in a problem in defining the pattern edge for small pattern spacings.

FIG. 3 shows a cross section view of a prior art attenuating phase shifting mask, the electric field of the light emerging from the mask, and the intensity of the light at the integrated circuit wafer. The mask comprises a transparent substrate 22 with a pattern formed in a layer of attenuating phase shifting material 24, such as CrON or MoSiO. A beam of light 26 illuminates the attenuating phase shifting mask. The electric field, E, of the light exiting the mask and the intensity, I, of the light focused on the integrated circuit wafer is also shown in FIG. 3. As can be seen from the intensity, I, of the light shown in FIG. 3 the definition of the pattern edge is improved with the use of the attenuating phase shifting mask compared to the binary mask shown in FIG. 2.

In forming photomasks which utilize phase shifting techniques it is frequently desirable to use attenuating phase shifting material which will absorb a part of the light incident on the attenuating phase shifting material as well as shift the phase of the light. Frequently the transmission coefficient of the phase shifting material used is too high at long wavelengths making alignment of the mask in the reduction stepper a problem. High transmission coefficients also make inspection for defects at mask manufacture a problem. The transmission of CrON is greater than 0.50 and of MoSiO is greater than 0.30 at the He—Ne laser wavelength of 623 nanometers.

It is a principle object of this invention to provide a material for forming attenuating phase shifting photomasks which has a transmittance of less than 0.15 for light having a wavelength of 365 nanometers (i-line) and less than 0.30 for light having a wavelength of about 600 nanometers.

It is another object of this invention to provide an attenuating phase shifting photomask using a material which has a transmission coefficient of less than 0.15 for light having a wavelength of 365 nanometers and less than 0.30 for light having a wavelength of about 600 nanometers.

It is another object of this invention to provide a method of forming an attenuating phase shifting material which has a transmittance of less than 0.15 for light having a wavelength of 365 nanometers and less than 0.30 for light having a wavelength of about 600 nanometers.

These objects are achieved using a layer of (LaNiO$_3$)$_x$(TiO$_2$)$_{1-x}$ as the attenuation phase shifting material. The layer of (LaNiO$_3$)$_x$(TiO$_2$)$_{1-x}$ is formed on a fused quartz substrate using rf magnetron co-deposition of LaNiO$_3$ and TiO$_2$.

DESCRIPTION OF THE PREFERRED EMBODIMENTS

Figure 4:
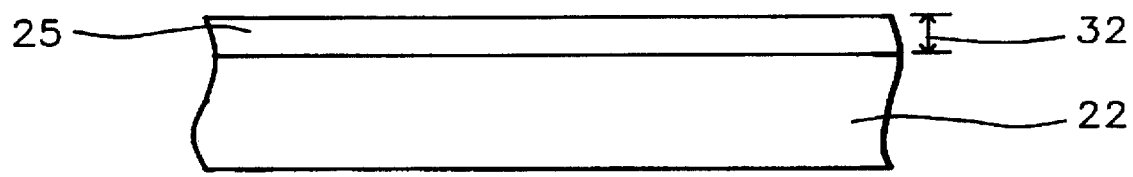
FIG. 4 shows a cross section view of a transparent mask substrate with the attenuating phase shifting material of this invention formed on the transparent mask substrate.
Figure 6:
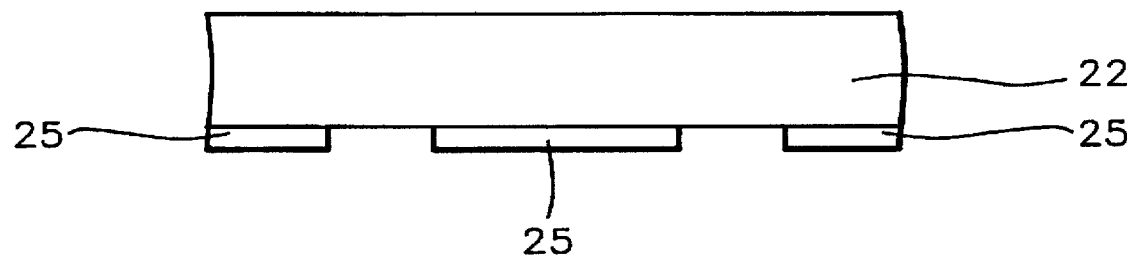
FIG. 6 shows a cross section view of an attenuating phase shifting mask using the attenuating phase shifting material of this invention.

Refer now to FIGS. 4 and 6, there is shown an embodiment of the attenuating phase shifting photomask of this invention. FIG. 4 shows a cross section of a transparent mask substrate 22, such as fused quartz, with a layer of attenuating phase shifting material 25 formed thereon. The attenuating phase shifting material is a composite material comprising a first material, such as LaNiO₃, having a large extinction coefficient, k, greater than about 0.8, and a second material, such as TiO₂, having a high index of refraction, n, greater than about 2.4. The extinction coefficient, k, is the imaginary part of the index of refraction and is related to the transmission coefficient of the material but does not depend on the material thickness.

The attenuating phase shifting material 25 is an oxide film of composition $(LaNiO_3)_x(TiO_2)_{1-x}$, or LNTO, having a thickness 32 of between about 110 nanometers and 280 nanometers where x is between about 0.5 and 0.8. The two major constituents of the LNTO film are LaNiO₃ and TiO₂. LaNiO₃ has an index of refraction, n, of about 1.8 and an extinction coefficient, k, of about 1.1. TiO₂ has an index of refraction, n, of about 2.6 and an extinction coefficient, k, of about 0.01 at the i-line wavelength of 365 nanometers. The LaNiO₃ and TiO₂ combine to form a LNTO film having an index of refraction between about 2.1 and 2.3 and an extinction coefficient of between about 0.35 and 0.55 for light having a wavelength between about 350 nanometers and 600 nanometers.

Figure 7:
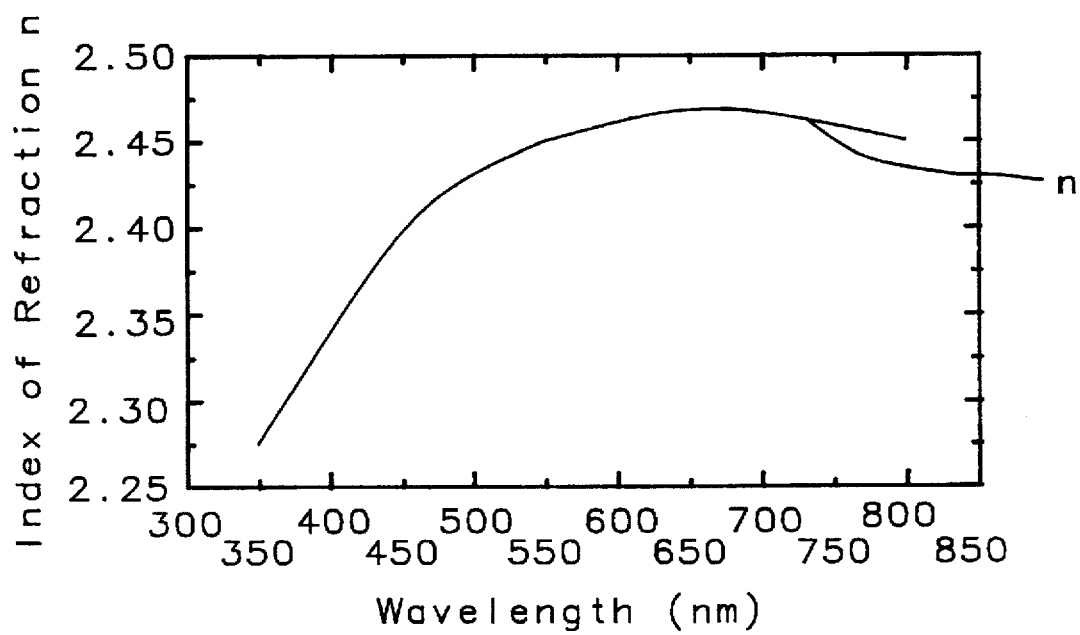
FIG. 7 shows a curve of the index of refraction as a function of light wavelength for a film of (LaNiO$_3$)$_x$(TiO$_2$)$_{1-x}$.
Figure 8:
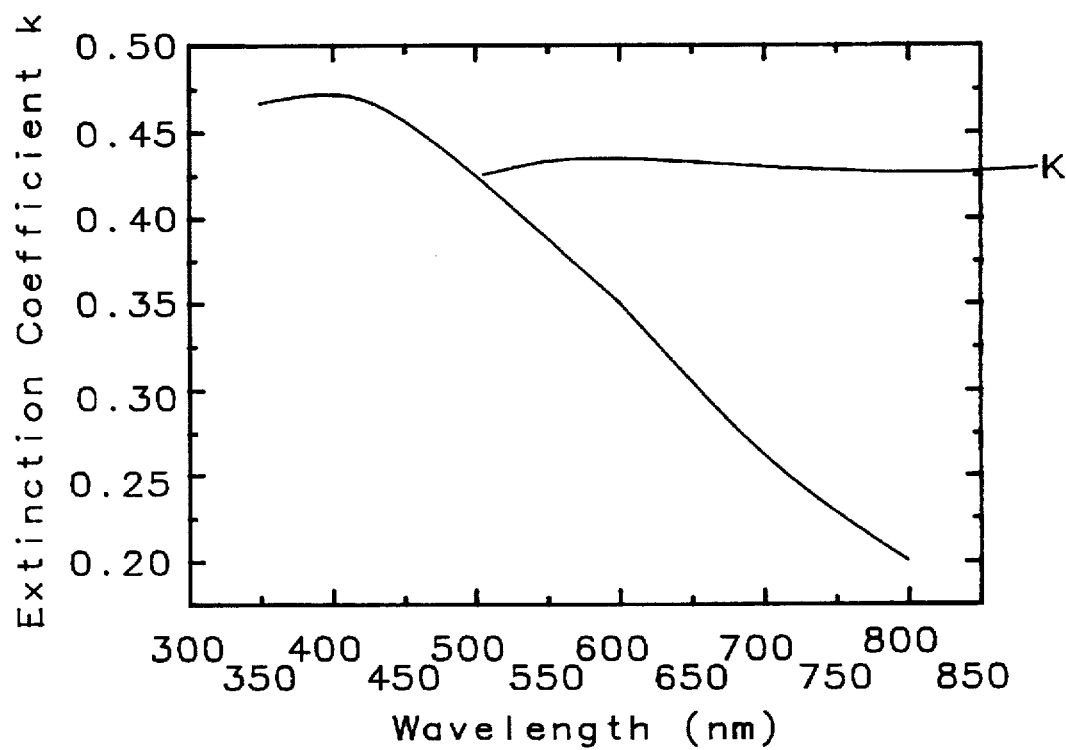
FIG. 8 shows a curve of the extinction coefficient as a function of light wavelength for a film of (LaNiO$_3$)$_x$(TiO$_2$)$_{1-x}$.
Figure 9:
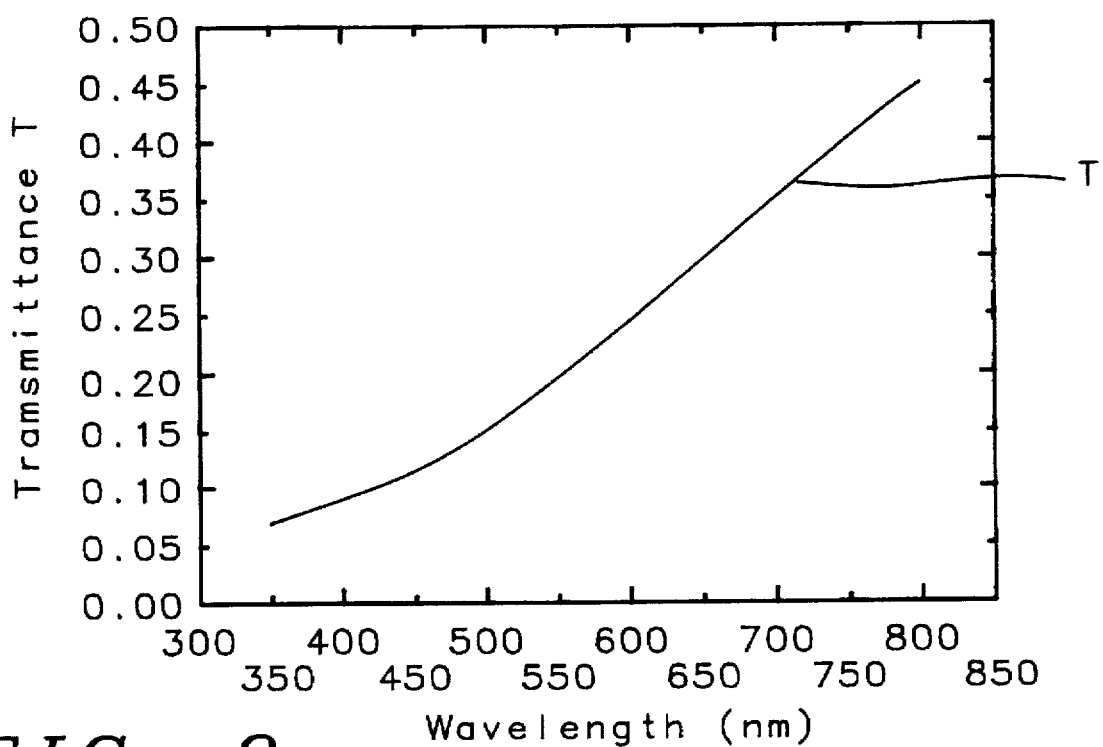
FIG. 9 shows a curve of the transmittance as a function of light wavelength for a film of (LaNiO$_3$)$_x$(TiO$_2$)$_{1-x}$ having a 180° phase shift at 365 nanometers.
Figure 10:
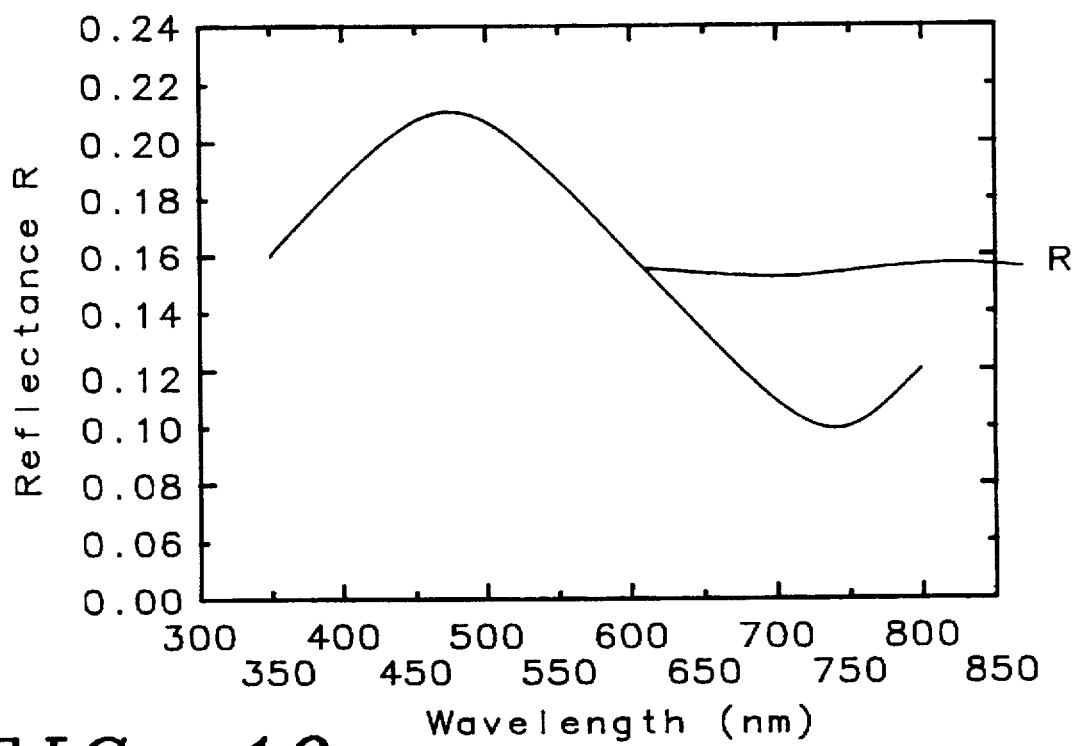
FIG. 10 shows a curve of the reflectance as a function of light wavelength for a film of (LaNiO$_3$)$_x$(TiO$_2$)$_{1-x}$ having a 180° phase shift at 365 nanometers.

The attenuating phase shifting layer must provide an optical phase shift of about 180°, which will depend in part on the thickness of the film. The thickness is given by (m+½) multiplied by the wavelength of the light used divided by the difference between the index of refraction of the LNTO film and the index of refraction of air), where m is an integer having values 0, 1, 2, 3 etc. FIGS. 7–10 show the optical properties of a LNTO film having a thickness which provides a 180° phase shift at the i-line wavelength of 365 nanometers. FIG. 7 shows the index of refraction, n, FIG. 8 the extinction coefficient, k, FIG. 9 the transmittance, T, and FIG. 10 the reflectance, R, of a LNTO film having a thickness which provides a 180° phase shift at the i-line wavelength of 365 nanometers.

A LNTO film having a thickness of about 141 nanometers will provide a phase shift of 180° and a transmittance of about 0.05 for light from an i-line light source having a wavelength of 365 nanometers and a transmittance of about 0.25 for light having a wavelength of 600 nanometers.

A LNTO film will have an index of refraction of between about 2.1 and 2.3 and an extinction coefficient of between about 0.35 and 0.55 for light having a wavelength between about 350 nanometers and 600 nanometers. This range of index of refraction and extinction coefficient will provide the desired transmittance of less than 0.15 when the thickness of the LNTO film is adjusted to provide a 180° optical phase shift for light having the i-line wavelength of 365 nanometers, a transmittance of less than 0.30 for light of about 600 nanometers, and a reflectance of less than 0.20 which will improve mask alignment.

As shown in FIG. 6, the attenuating phase shifting mask is completed by forming a pattern in the layer of attenuating phase shifting material 25, such as LNTO described above, which has been formed on the transparent substrate 22.

Figure 5:
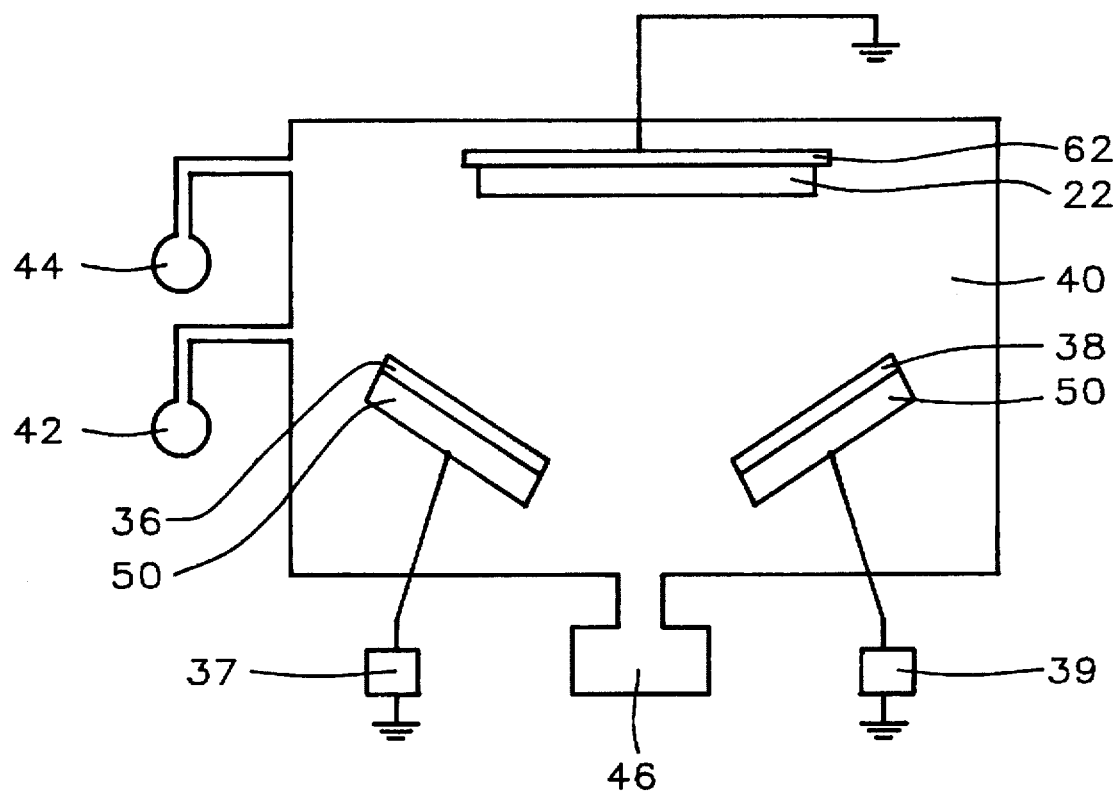
FIG. 5 shows a block diagram of an rf magnetron sputtering apparatus used to deposit the attenuating phase shifting material of this invention.

Refer now to FIGS. 4–6, there is shown an embodiment of a method of forming the attenuating phase shifting mask of this invention. As shown in FIG. 4 a first material having a large extinction coefficient, k, greater than about 0.8, and a second material having a high index of refraction, n, greater than about 2.4 are co-deposited on a transparent substrate 22. In this embodiment the first material is LaNiO₃, the second material is Ti, the transparent substrate is quartz, and the first and second materials are co-deposited using rf magnetron sputtering.

Refer now to FIG. 5, there is shown a block diagram of a sputtering system for accomplishing the rf magnetron sputtering. As shown in FIG. 5 the quartz substrate 22 is placed on a grounded surface 62 in the sputtering chamber 40. Magnets 50 supply the magnetic field for the magnetron sputtering. A LaNiO₃ target 36 and a Ti target 38 are placed in the sputtering chamber. The LaNiO₃ target 36 is connected to a first rf power supply 37 and the Ti target 38 is connected to a second rf power supply 39. A source of oxygen 42 and a source of argon 44 are connected to the sputtering chamber. A vacuum pump 46 is connected to the sputtering chamber 40 and controls the pressure in the chamber.

For the co-deposition of LaNiO₃ and TiO₂ the first rf power supply 37 supplies between about 2.47 and 3.45 watts/cm² to the LaNiO₃ source 36, the second power supply 39 supplies between about 7.0 and 9.0 watts/cm² to the Ti source 38, the pressure in the sputtering chamber is controlled by the vacuum pump 36 at about 10 mTorr, the oxygen flow rate is between about 5 and 6 sccm or standard cubic centimeters per minute, and the argon flow rate is about 45 sccm. This co-deposition results in a film comprising primarily $(LaNiO_3)_x(TiO_2)_{1-x}$, or LNTO, where x is between about 0.5 and 0.8. The LNTO film deposited in this manner will have an index of refraction, n, of between about 2.1 and 2.3 and an extinction coefficient, k, of between about 0.35 and 0.55. The thickness 32, see FIG. 4, of the LNTO film is adjusted to provide a 180° phase shift for the wavelength of light which will be used to illuminate the mask. For an i-line source having a wavelength of 365 nanometers the thickness 32 will be about 100 nanometers to 200 nanometers.

Figure 1:
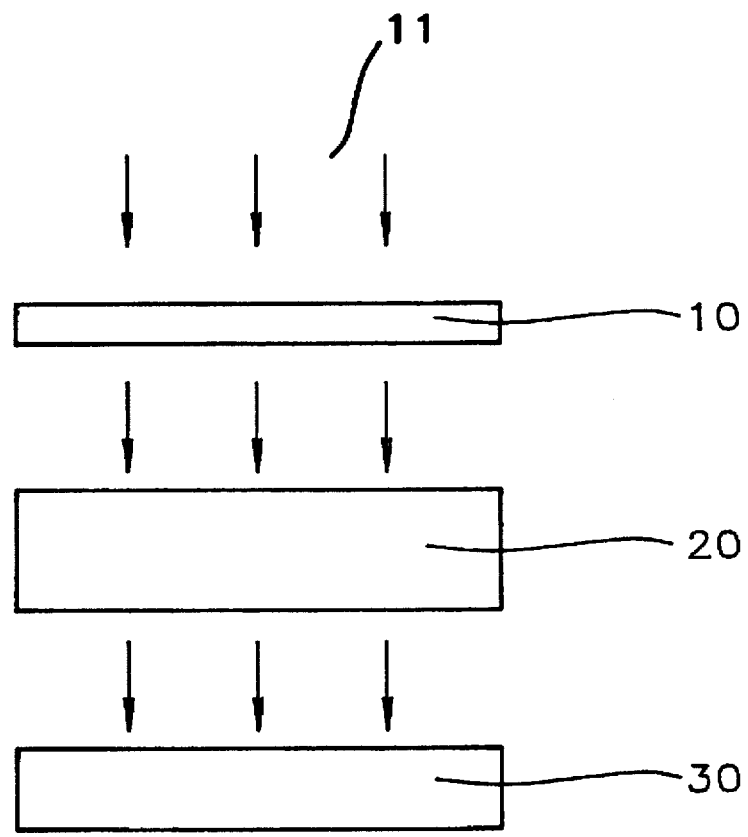
FIG. 1 is a block diagram of a conventional reduction stepper for forming a mask image on an integrated circuit wafer.
Figure 2:
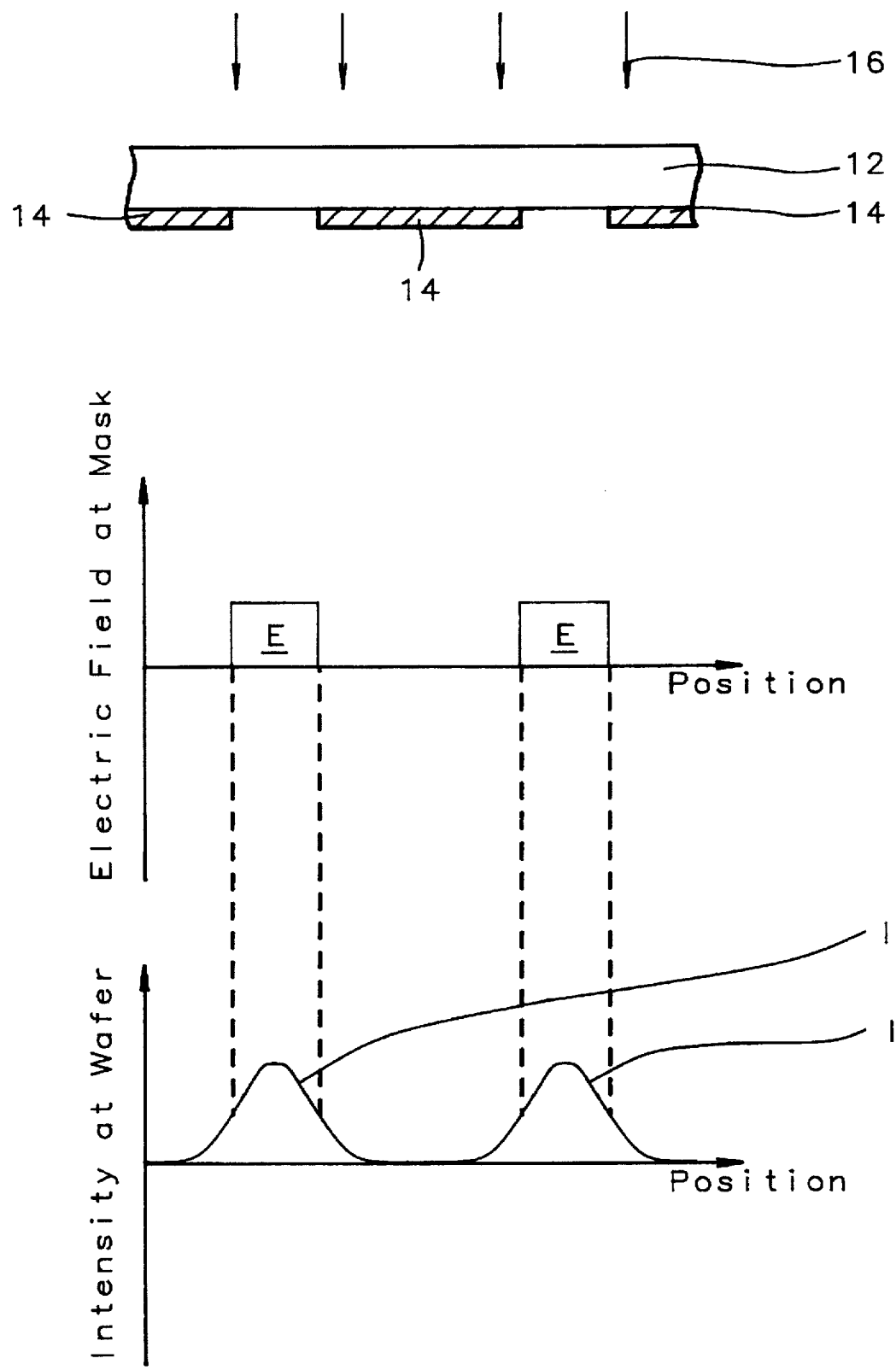
FIG. 2 shows a cross section view of a prior art binary mask, the electric field of the light emerging from the mask, and the intensity of the light at the integrated circuit wafer.
Figure 3:
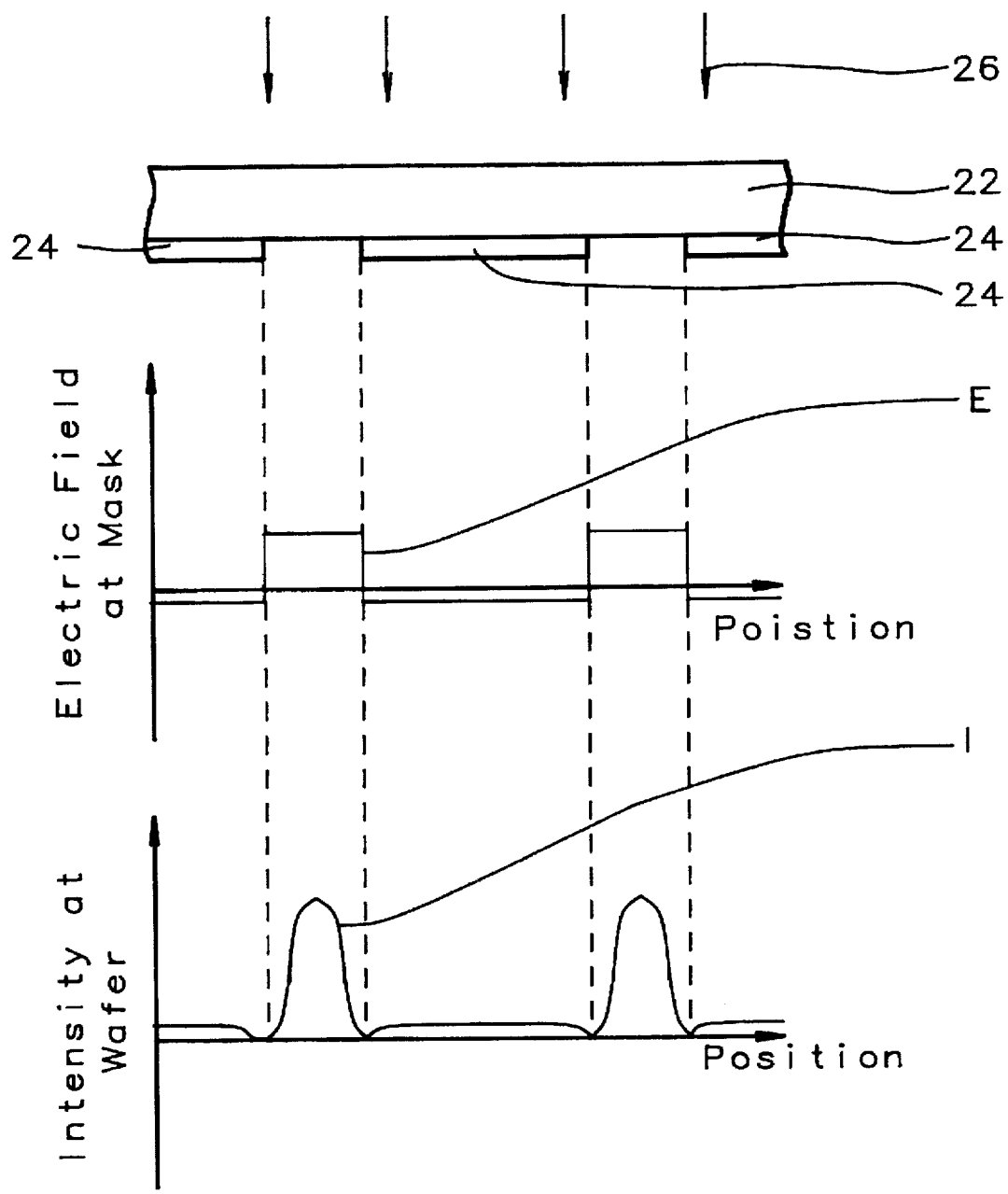
FIG. 3 shows a cross section view of a prior art attenuating phase shifting mask, the electric field of the light emerging from the mask, and the intensity of the light at the integrated circuit wafer.

As shown in FIG. 6 a pattern is formed in the LNTO layer 25 which has been formed on the transparent quartz substrate 22. The mask is then completed and is used in a reduction stepper as shown in FIG. 1 and described earlier.

While the invention has been particularly shown and described with reference to the preferred embodiments thereof, it will be understood by those skilled in the art that various changes in form and details may be made without departing from the spirit and scope of the invention.

What is claimed is:

1. An attenuating phase shifting mask, comprising:
   a transparent substrate; and
   a pattern of attenuating phase shifting material formed on said transparent substrate wherein said attenuating phase shifting material is a composition of LaNiO₃ and TiO₂ formed as $(LaNiO_3)_x(TiO_2)_{1-x}$ and has an index of refraction of between about 2.1 and 2.3 for light having a wavelength of between about 350 nanometers and 600 nanometers, an extinction coefficient of between about 0.35 and 0.55 for light having a wavelength of between about 350 nanometers and 600 nanometers, and provides a 180° phase shift for light having a wavelength of about 365 nanometers.

2. The attenuating phase shifting mask of claim 1 wherein said LaNiO₃ has an index of refraction of between about 1.8 and 2.6 and an extinction coefficient of between about 1.0 and 1.3 for light having a wavelength of between about 350 nanometers and 600 nanometers and said TiO₂ has an index of refraction of between about 2.2 and 2.7 and an extinction coefficient of between about 0.00 and 0.05 for light having a wavelength of between about 350 nanometers and 600 nanometers.

3. The attenuating phase shifting mask of claim 1 wherein said $(LaNiO_3)_x(TiO_2)_{1-x}$ has a thickness of between about 100 nanometers and 200 nanometers.

4. The attenuating phase shifting mask of claim 1 wherein x is between about 0.5 and 0.8.

5. The attenuating phase shift mask of claim 1 wherein said transparent substrate is quartz.

6. An attenuating phase shifting material, comprising:

a first material having an index of refraction of between about 1.8 and 2.6 and an extinction coefficient of between about 1.0 and 1.3 for light having a wavelength of between about 350 nanometers and 600 nanometers, wherein said first material is $LaNiO_3$; and a second material having an index of refraction of between about 2.2 and 2.7 and an extinction coefficient of between about 0.00 and 0.05 for light having a wavelength of between about 350 nanometers and 600 nanometers, wherein said second material is $TiO_2$.

7. The attenuating phase shifting material of claim 6 wherein said first material and said second material form a composite of $(LaNiO_3)_x(TiO_2)_{1-x}$ and said composite has an index of refraction of between about 2.1 and 2.3 and an extinction coefficient of between about 0.35 and 0.55 for light having a wavelength of between about 350 nanometers and 600 nanometers.

8. The attenuating phase shifting material of claim 7 wherein x is between about 0.5 and 0.8.

9. The attenuating phase shifting material of claim 7 wherein said composite of $(LaNiO_3)_x(TiO_2)_{1-x}$ has a thickness of between about 100 nanometers and 200 nanometers.

10. A method of forming an attenuating phase shifting mask, comprising the steps of:

providing a transparent substrate;

forming a layer of $(LaNiO_3)_x(TiO_2)_{1-x}$ on said transparent substrate; and forming a pattern in said layer of $(LaNiO_3)_x(TiO_2)_{1-x}$ on said transparent substrate; and forming a pattern in said layer of $(LaNiO_3)_x(TiO_2)_{1-x}$.

11. The method of claim 10 wherein said layer of $(LaNiO_3)_x(TiO_2)_{1-x}$ is formed by co-depositing $LaNiO_3$ and $TiO_2$ using rf magnetron sputtering deposition.

12. The method of claim 10 wherein x is between about 0.5 and 0.8 and said layer of $(LaNiO_3)_x(TiO_2)_{1-x}$ has an index of refraction of between about 2.1 and 2.3 and an extinction coefficient of between about 0.35 and 0.55 for light having a wavelength of between about 350 nanometers and 600 nanometers.

13. The method of claim 10 wherein said layer of $(LaNiO_3)_x(TiO_2)_{1-x}$ has a thickness of between about 100 nanometers and 200 nanometers.

14. The method of claim 10 wherein said transparent substrate is quartz.

* * * * *